(12) United States Patent
Esch

(10) Patent No.: US 6,552,568 B2
(45) Date of Patent: Apr. 22, 2003

(54) LEVEL SHIFTER CIRCUIT FOR LEVEL ADJUSTMENT

(75) Inventor: Rainer Esch, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 09/989,961

(22) Filed: Nov. 21, 2001

(65) Prior Publication Data

US 2002/0063580 A1 May 30, 2002

(30) Foreign Application Priority Data

Nov. 29, 2000 (DE) .................... 100 59 309 A1

(51) Int. Cl.[7] .......................................... H03K 19/0175
(52) U.S. Cl. ................... 326/63; 326/56; 326/80
(58) Field of Search ................ 326/56, 57, 58, 326/80, 81, 82, 83, 63, 68

(56) References Cited

U.S. PATENT DOCUMENTS

| 5,568,062 | A | * | 10/1996 | Kaplinsky | ................ 326/27 |
| 5,680,063 | A | * | 10/1997 | Ludwig et al. | ............ 326/80 |
| 5,726,590 | A | * | 3/1998 | Isono | .................... 326/86 |
| 6,028,447 | A | | 2/2000 | Andrews | |
| 6,114,884 | A | * | 9/2000 | Kaplinsky | ................ 327/108 |

FOREIGN PATENT DOCUMENTS

| DE | 196 44 772 | | 10/1996 |
| DE | 196 44 772 C2 | | 5/1998 |
| EP | 533340-A2 A3 | * | 3/1993 |
| EP | 92307286 | | 3/1993 |
| EP | 0616430-A2 A3 | * | 6/1994 |
| EP | 94301383 | | 9/1994 |
| EP | 0934641 B1 | * | 8/1999 |
| FR | 2 748 359 | | 11/1997 |

OTHER PUBLICATIONS

Patent Abstracts of Japan, Publication No. 01181223 Applicant: NEC Corp; Inventor: Koga Hiroshi.
Patent Abstract of Japan Applicant: NEC Corp; Appln No.: 63005754 Appln Date: Jan. 13, 1988.
Springer Verlag, "Digital techik Grundlagen" XP–002186983, pp. 638–639.

* cited by examiner

Primary Examiner—Daniel Chang
(74) Attorney, Agent, or Firm—Charles E. Baxley

(57) ABSTRACT

Apparatuses for level adjustment are essential to make adjustments to signals between integrated circuits having differing signal levels in electronic circuits. To assure signal adjustment for a large number of signals, as occur in parallel busses, an apparatus for level adjustment is used. This digital level adjustment uses the I/O cells already present in the integrated circuits with an externally wired pullup resistor and an internal digitally programmed or constructed signal connection for controlling output drivers.

9 Claims, 3 Drawing Sheets

LEVEL SHIFTER CIRCUIT FOR LEVEL ADJUSTMENT

BACKGROUND OF THE INVENTION

1. Field of the Invention

The invention relates to a circuit for level adjustment on the output side between a programmable, large-scale integrated component having low signal voltage and a microprocessor system having high signal voltage.

2. Description of the Prior Art

The ongoing development of semiconductor technology in terms of functionality, circuit speed, and circuit density has led to constant reduction in the supply and signal voltages.

Since large-scale integrated semiconductor components having differing supply and signal voltages are used in electronic circuits on printed circuit boards, it is essential to provide for a level adjustment of the signals that assures the connection of these LSI semiconductor components. If a circuit includes only example CMOS level 5 V, it is not necessary to provide for level adjustment.

By way of example, if the output signals from an FPGA (Field Programmable Gate Array), which has a 3.3 V power supply because of its circuit density, are connected to a component having a 5 V power supply and CMOS input level, the output signals will not be recognized by the CMOS" component unless means for level adjustment are provided. The FPGA generates the "1" state with, for example, 2.4 V, but confident "1" recognition by the CMOS component may be set at 4.2 V. The signal level must therefore be adjusted so that the signal level for the "1" state is raised above the input threshold for recognition of the "1" state by the CMOS component.

An open drain output with pullup resistor, as described in "The Programmable Logic Data Book", Xilinx, 1999 may be used to this end. Another description of an open drain output is included in "High-Speed CMOS logic Data", Motorola, 1988. This output only switches the output to ground in the "0" state. In the "1" state, the output is highly resistive, so that only the pullup resistor that is connected to the higher line voltage raises the signal line to the higher signal level. This arrangement has the critical disadvantage, however, that the response time in large resistors is significant. In order to shorten the response time, the pullup resistor must be made smaller, which itself entails the disadvantage of increased current consumption in the "0" state. For example, when its output is switched to "0", a 1000 Ohm pullup resistor draws 5 mA signal current. When a large number of level-adjusted signals are involved, the total drawn signal current is accordingly very large.

If a pullup resistor is wired to a true push-pull output in an integrated circuit that has low supply voltage, depending on the push-pull output's internal configuration, an undesirable cross-current may be created. This cross-current is caused by the resistive value of the pullup resistor and the potential difference between the first lower supply voltage and the second higher supply voltage. In particularly extreme cases, the cross-current can destroy the push-pull output. One reliable method for adjusting signal levels that also gives fast switching speeds is provided by the use of a levelshifter component, which is described in the datasheet "SN54CBTD3384, SN74CBTD3384 10-Bit FET Bus Switches with Level Shifting", published in 1995 by Texas Instruments and revised in 1998. The output from the component with low signal voltage is coupled to the levelshift component's input. The levelshifter component's output is in turn coupled to the input of the component with high signal voltage. The critical disadvantage of this arrangement is that one or more levelshifter components must also be integrated into the circuit as a whole, thus taking up additional space on the printed circuit board and having the effect of increasing the cost of the electronic circuit on the printed circuit board. The circuit for level adjustment that is described in DE 196 44 772 C2, and which is designed to be inexpensive, also suffers from the disadvantage that 4 resistors and two bipolar transistors are required for each signal to be converted. In wide, parallel, level-adjusted system buses a large number of stand-alone components are needed, which increase the space requirement on the printed circuit board for the electronic circuit and entail greater assembly effort during manufacture. In addition, the possible signal distortion and signal load of this level adjustment as described in DE 196 44 772 C2 is not acceptable for rapid parallel system buses. If its use is restricted exclusively to the purpose described in DE 196 44 772 C2 of coupling two integrated circuits having different signal voltages by means of a 12C bus with just a small number of signals, the inexpensive transistor circuit described in DE 196 44 772 C2 is indeed adequate, but with a large number of signals requiring level adjustments, this arrangement is too cumbersome and thus disadvantageous.

A bidirectional voltage converter is known from patent document FR 2 748 359 B1, according to which the voltage levels are generated by means of pullup resistors. The voltage converter described in FR 2 748 359 B1 does not require any control signals to determine the data direction. In this case, the fact that a latch with bidirectional effect and the pullup resistors have to be integrated may be considered disadvantageous. A voltage converter for level adjustment of this kind can only be included in a programmable, large-scale integrated FPGA component as a supplementary measure.

SUMMARY OF THE INVENTION

The object of the invention is to provide an inexpensive, space-saving level device for adjusting levels between a programmable, large-scale integrated FPGA component having low signal voltage and a microprocessor system having high signal voltage.

The level adjusting device must consist of a very few, small components, or none at all because of the limited space available. At the same time, the use of commercially available integrated components should be avoided for reasons of cost.

The object is resolved according to the invention by a pullup resistor that is connected to the output of a programmable, large-scale integrated FPGA component having low signal voltage. Internally, the internal output signal is digitally combined with the output signal in feedback from the output path, such that for a signal state change from "0" to "1" the output level of the signal is the active driver up to the value "1" of the low signal voltage, and when the "1" state is reached, the output driver is switched to high resistance (tri-state) for the low output level, so that only the pullup resistor is in effect for increasing the level to the high signal level. Consequently, the pullup resistor is not involved for the entire signal gain, but is only active for the remaining difference between the low signal level of the output driver and "1" threshold value of the input having high signal level. The slow build-up time that characterizes an open drain circuit is shortened in this application to a period that is sufficient for this function. The pullup resistor is capable of receiving a value from twice to four times as high as is possible in a purely open drain wiring, which serves to keep power loading due to signal currents low.

The circuit for level adjustment according to the invention is also capable of functioning in conjunction with programmable, large-scale integrated components having a signal voltage of 2.5 V. This entails a slightly longer build-up time for the signal, because the signal level that must be increased by the pullup resistor is greater.

The invention will be described in the following with reference to an exemplary embodiment thereof and the associated figures.

DETAILED DESCRIPTION OF THE PREFERRED EMBODIMENT

Figure 1:
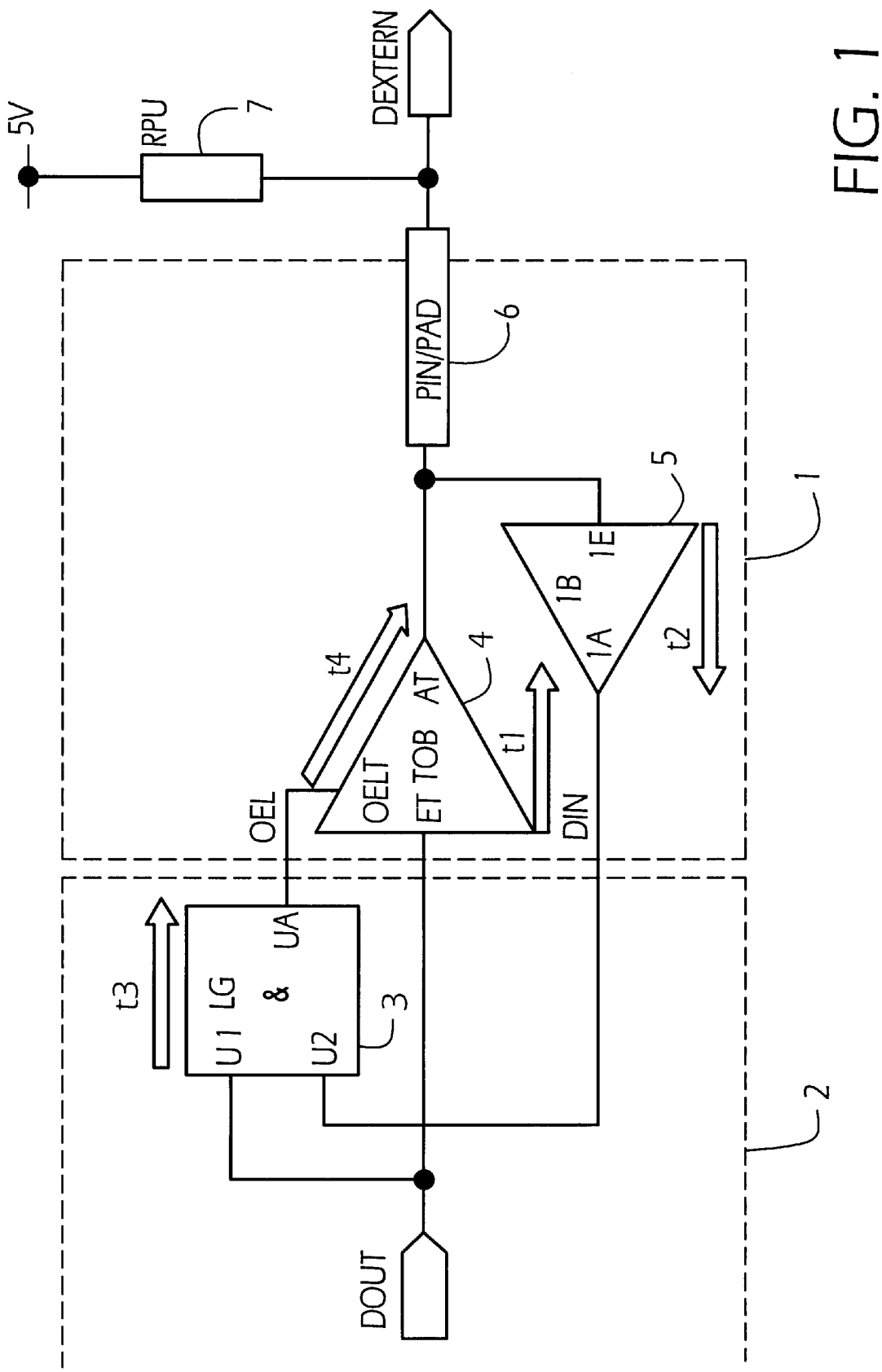
FIG. 1: shows the driver circuit of an output cell in a programmable, large-scale integrated FPGA component.

In FIG. 1, the driver circuit according to the invention is shown with output driver and input circuit in an FPGA having low signal voltage and 3.3 V supply voltage.

An output driver 4 is driven by a OEL signal generated in a FPGA digital section 2. The output signal path created by the output driver 4 is returned to the FPGA digital section 2 of the FPGA via an input buffer 5 located in an I/O block 1, and fed to a digital AND gate 3.

Figure 2:
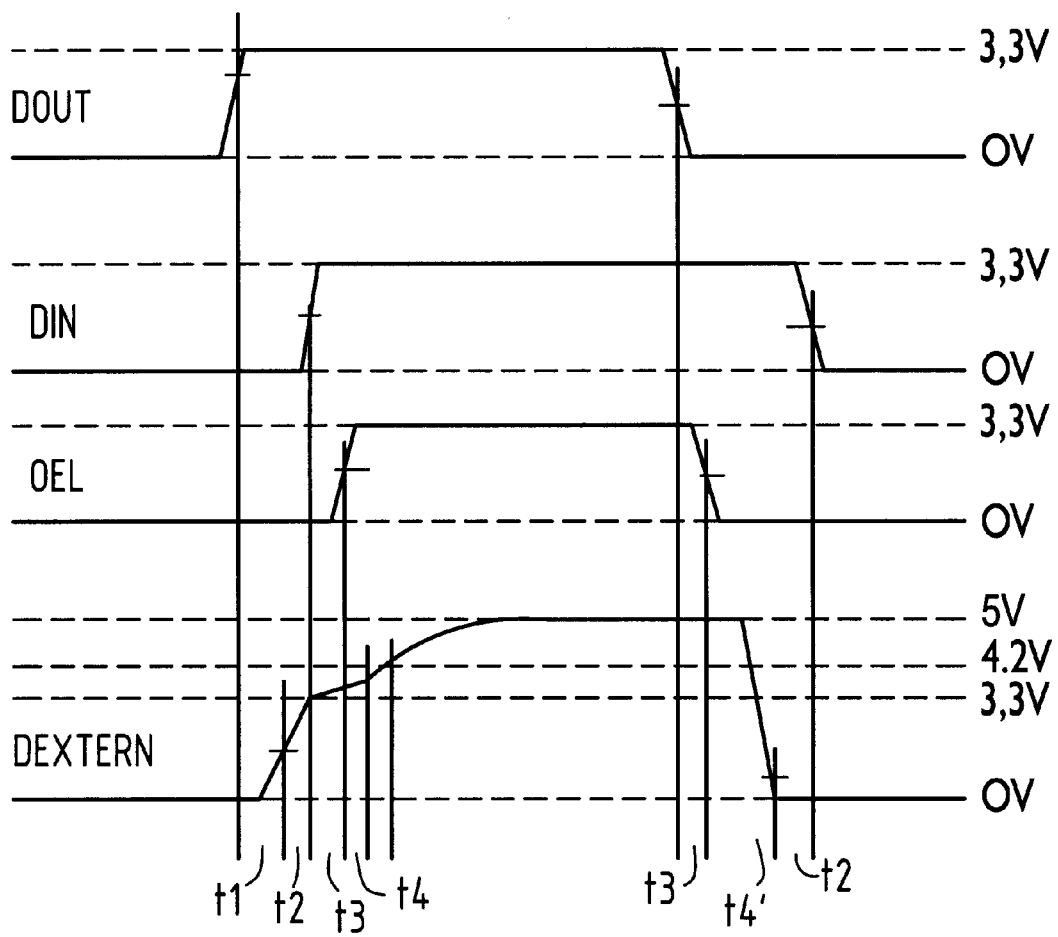
FIG. 2: shows the signal behavior in the individual ports of the output cell in the FPGA.

Input buffer 5 has the effect of delaying the DIN signal by a few ns. Depending on the type of I/O block 1 and the FPGA, it is also possible to provide a parameterizable input delay. The internal digital output signal DOUT and the feedback-looped DIN output signal arrive at the input side of the digital AND gate 3. The output OEL from digital AND gate 3 is switched at the low-active release input OELT of the output driver 4 so that release of the output driver 4 is driven by the DOUT signal generated in FPGA digital section 2 in the "1" state and the DIN output signal that is delayed and in feedback via the output driver 4. The output signal DEXTERN is transferred from the FPGA or maskprogrammable integrated circuit to the outside, via an output terminal PIN/PAD 6 away from the component. In FIG. 2, the behavior of the internal signals and output signals is illustrated against a timescale. In the following, the control will be explained in steps with reference to FIG. 2 and on the basis of the terms illustrated in FIG. 1.

Step 1: The output driver 4 is switched to "0" by the DOUT signal generated in FPGA digital section 2, the "0" state of the DOUT signal is also at input U1 of AND gate 3. Release signal OEL is kept in the "0" state by operation of the digital AND gate 3, which causes the output driver 4 to switch the current DOUT state "0" to its output AT. Feedback-looped output signal DIN also has state "0" and is incident on the second input U2 of the digital AND gate 3, which causes output signal DEXTERN also to have state "0".

Step 2: At this point, switching begins to switch the state of signal DEXTERN from "0" to "1". The DOUT signal generated internally in the FPGA digital section 2 is switched to "1". Now there is a "1" at first input U1 of the digital AND gate 3 because of the DOUT signal, but the DIN signal at the second input U2 of the digital AND gate 3, which has been feed-back looped and delayed by t1 plus t2, still has a "0" state. Delay t1 is created by the gate runtime of the input buffer 5. As a consequence, the OEL output of the digital AND gate 3 is still in the "0" state, so that the output driver 4 will return the current "1" state for internal output signal DOUT to its output AT, delayed by t1.

Step 3: Delay times t1 plus t2, which together might possibly amount to, for example, 5 ns with regard to the build-up time of the output signal, have elapsed. The DOUT signal at first input U1 of the digital AND gate 3 is now in the "1" state, while the feedback-looped and delayed output signal DIN, is now in state "1" at the other input U2 of the digital AND GATE 3. As a result, the OEL output of the digital AND gate 3 also receives state "1", which causes the output driver 4 to switch off or switch to high resistance after delay time t4 has elapsed. Time t4 is the delay time from activation or deactivation of activation input OELT at the output driver 4 until it takes effect on output AT.

Figure 3:
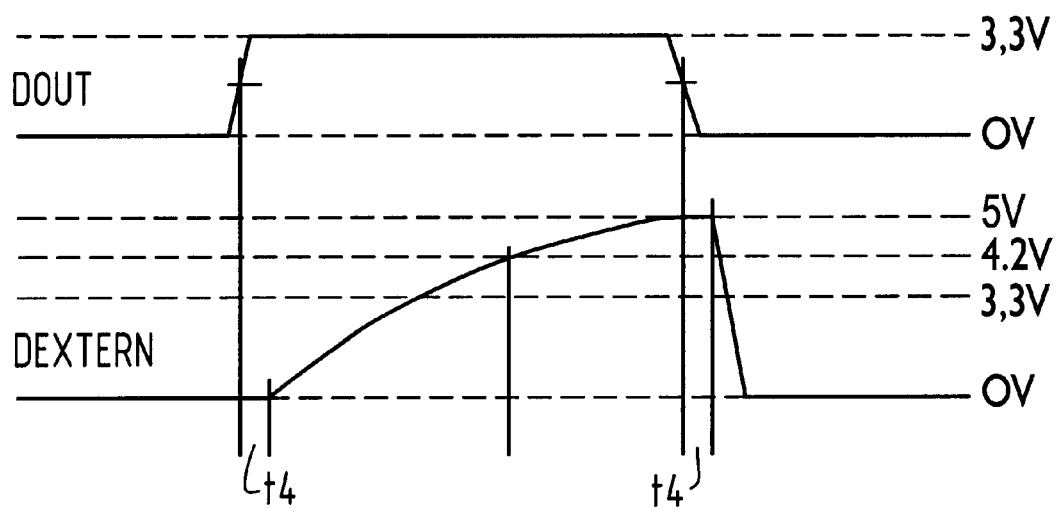
FIG. 3: shows the signal behavior with conventional open drain wiring (state of the art).

Step 4: After the output driver 4 has been switched off, a pullup resistor 7 is exclusively responsible for ensuring that the level of the signal voltage is adjusted after the driven build-up time t1 is increased by the difference until it reaches the input threshold value of the component with the higher signal voltage. The time required for this to happen is designated t5. For comparison purposes, the timespan of a signal change with a standard open drain output circuit is illustrated in FIG. 3. In this circuit the output is switched to high resistance with a delay t4 for switching the open drain output. The output that has been increased by a pullup resistor on "1" then reaches the threshold input value of, for example, 4.2 V that is required for recognition by a CMOS component after time t5. In this arrangement, the total delay time t4 plus t5 is significantly longer than the combined delay times t1, t2, t3, t4 and t5 in the arrangement according to the invention.

Step 5: In this step, the state of the DOUT signal is switched from "1" to "0". When the internal digital output signal DOUT has reverted to the "0" state, release signal OEL achieves the "0" state at input OELT of the output driver 4, delayed by t3, and activates output AT, delayed by t4, which causes signal DEXTERN to assume the "0" state Feedback-looped and delayed output signal DIN, which has been feedback-looped via the input buffer 5 and delayed achieves the "0" state after a further delay t2, but this is no longer of consequence for this circuit.

As is shown in FIG. 1, the condition for bidirectional functioning is created in the FPGA by programming of the I/O cell. A delay time in the order of, for example, 5 ns is set in the input circuit. The internal output signal DOUT is combined with feedback-looped output signal DIN by means of the digital AND gate 3 or a circuit that assures the same functionality for generating the release singal OEL for the output driver 4. The combination to control the output driver 4 takes place in the FPGA digital section 2, so that the present invention may be considered to be a digital means of level adjustment.

Figure 4:
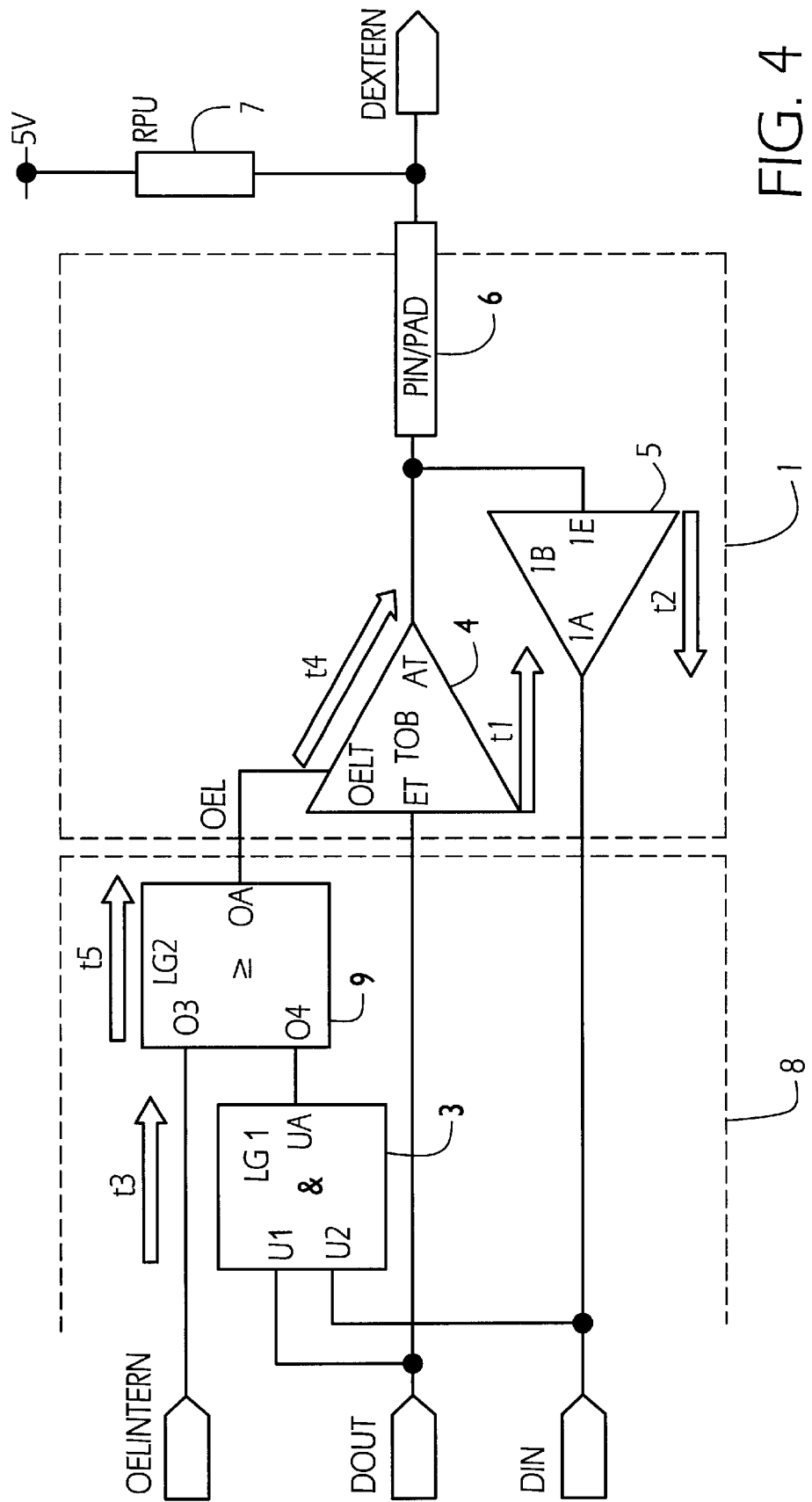
FIG. 4: shows a variant of the driver circuit according to the invention for bidirectional use in a programmable large-scale integrated FPGA component.

FIG. 4 shows a variant for an output-side level adjustment with bidirectional function. In this variant the signal OELINTERN is generated from a FPGA digital part 8 for switching on the output driver 4. This release signal OELINTERN is delivered to input O3 of a supplementary logic gate 9 having logical OR function. The release signal, which is the result of internal data signal DOUT and the feedback-looped and delayed output signal DIN through the digital AND gate 3 is at input O4. If the bidirectional I/O block 1 is switched to output, the digitally controlled function of level adjustment is activated, since OELINTERN has state "0", so that only the digital AND gate 3 functions to generate release signal OEL for switching the output driver 4. The bidirectional I/O block 1 is switched to input, control signal OELINTERN that is generated in the FPGA digital part 8 has state "1". In this way, a following OR gate 9 ensures that release signal OEL always has state "1" and the digitally controlled level adjustment function cannot affect release signal OEL. Each logical state of the signal DEXTERN at the output terminal is transferred to the FPGA digital part 8 via the input buffer 5, so that release signal OEL for the output driver 4 is not influenced by the state of input signal DIN.

A further advantage of this invention is that it can also be used in mask-programmable integrated circuits such as gate arrays, or in integrated circuits that are produced to customer specifications (standard cell or full customer ICs). In this case, the I/O blocks are produced in the form of an analog application and include circuit components that have been prefabricated and tested by the manufacturer of the digital circuit, while the digital level adjustment with the digital logic gates is included in the customer-specific digital part. The present invention therefore also means that no new I/O blocks in such circuits for level adjustment need to be manufactured and tested in the form of analog applications.

What is claimed is:

1. An integrated circuit, comprising:
   a) an output driver having a low signal voltage;
   b) a digital logic gate coupled to the output driver;
   c) an input buffer providing a feed-back looped input from the output driver to the digital logic gate;
   d) an output terminal coupled to the output driver; and
   e) a pullup resistor;
   wherein the pullup resistor is connected to the output terminal and an output signal of the output driver is adjusted from the low signal voltage to a second integrated circuit having a high signal voltage, to increase the output signal from the low signal level to the high signal level;
   wherein the output driver is switched inactive for the period during which the level of the output signal from said output terminal is increased across the pullup resistor by the level difference between the low signal level and the high signal level.

2. The circuit according to claim 1, wherein the output from said output driver actively drives its "1" state to said output terminal during switching from the "0" state to the "1" state and when the output-side maximum "1" signal level of the low signal level is reached, the output of said output buffer is switched to the highly resistive state (TRI-state).

3. The circuit according to claim 1 or 2, wherein the logical switching operation for generating the release signal for said output driver is assured by said digital logic gate.

4. The circuit according to claim 1 or 2, wherein said output driver, said input buffer, and said output terminal are programmed from available circuit components of an I/O cell of an FPGA.

5. The circuit according to claim 1 or 2, wherein said output driver, said input buffer, and said output terminal are built from the available circuit components of an I/O cell of an integrated circuit that can be programmed to specifications via a mask.

6. The circuit according to claim 3, wherein said logic gate providing the digital logic operation for generating the control signal for said output driver by logic elements in the programmable digital part of an FPGA.

7. The circuit according to claim 3 wherein said logic gate providing the digital logic operation for generating the control signal for said output driver by logic elements in the digital part of an integrated circuit that can be programmed to specifications via a mask.

8. The circuit according to claim 3, wherein said logic gate providing the digital logic operation for controlling said output driver for level adjustment by a digital circuit that is constructed externally using standard logic elements.

9. An integrated circuit, comprising:
   a) an output driver having a low signal voltage;
   b) a digital logic gate coupled to the output driver;
   c) an input buffer providing a feed-back looped input from the output driver to the digital logic gate and the input signal for bidirectional application with bidirectional functionality to the digital part;
   d) an output terminal coupled to the output driver; and
   e) a pullup resistor;
   wherein the pullup resistor is connected to the output terminal and an output signal of the output driver is adjusted from the low signal voltage to a second integrated circuit having a high signal voltage, to increase the output signal from the low signal level to the high signal level; and
   wherein the output driver is switched inactive for the period during which the level of the output signal from said output terminal is increased across the pullup resistor by the level difference between the low signal level and the high signal level.

* * * * *